(12) United States Patent
Ha et al.

(10) Patent No.: US 7,315,221 B2
(45) Date of Patent: Jan. 1, 2008

(54) METHOD AND CIRCUIT FOR CONTROLLING A REFRESH OF A SEMICONDUCTOR MEMORY DEVICE

(75) Inventors: Min-Yeol Ha, Gwacheon-si (KR); Gyu-Hong Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 11/393,189

(22) Filed: Mar. 28, 2006

(65) Prior Publication Data

US 2006/0244490 A1 Nov. 2, 2006

(30) Foreign Application Priority Data

Apr. 29, 2005 (KR) .................. 10-2005-0036253

(51) Int. Cl.
*H03B 5/24* (2006.01)
*H03L 1/02* (2006.01)
(52) U.S. Cl. .................. 331/176; 331/57; 331/186
(58) Field of Classification Search .................. 331/57, 331/66, 176, 185–186
See application file for complete search history.

(56) References Cited

U.S. PATENT DOCUMENTS

| | | | |
|---|---|---|---|
| 5,600,281 A | 2/1997 | Mori et al. | 331/57 |
| 6,597,614 B2 | 7/2003 | Nam et al. | 365/222 |
| 6,946,896 B2 * | 9/2005 | Behzad | 327/512 |

FOREIGN PATENT DOCUMENTS

| | | |
|---|---|---|
| JP | 07-141865 | 6/1995 |
| KR | 1999-19949 | 6/1999 |
| KR | 10-2002-0002659 | 1/2002 |

* cited by examiner

*Primary Examiner*—David Mis
(74) *Attorney, Agent, or Firm*—Mills & Onello LLP

(57) ABSTRACT

A refresh control circuit includes a reference voltage generating circuit and an oscillator unit. The reference voltage generating circuit generates a reference voltage based on a variation in a drain-to-source voltage of a field effect transistor according to a temperature variation. The oscillator unit generates a pulse signal having a period that varies according to the temperature based on the reference voltage. The refresh period is thereby controlled automatically, in accordance with the operating temperature.

32 Claims, 11 Drawing Sheets

METHOD AND CIRCUIT FOR CONTROLLING A REFRESH OF A SEMICONDUCTOR MEMORY DEVICE

CLAIM FOR PRIORITY

This application claims priority under 35 USC § 119 to Korean Patent Application No. 2005-36253, filed on Apr. 29, 2005, the contents of which are herein incorporated by reference in their entirety for all purposes.

BACKGROUND OF THE INVENTION

1. Field of the Invention

The present invention relates to a refresh control circuit and a method of controlling a refresh procedure of a semiconductor memory device, and more particularly to a refresh control circuit and a method of controlling a refresh procedure of the semiconductor memory device in which a refresh period is controlled according to temperature variation.

2. Description of the Related Art

A unit cell of a Dynamic Random Access Memory (DRAM) typically consists of one transistor and one storage capacitor to achieve a high degree of integration. An initial amount of electric charge in the storage capacitor may be reduced due to leakage current generated by the transistor. That is, data stored in the unit cell of the DRAM may be lost unintentionally. To prevent the loss of the data, a DRAM can perform a refresh operation. Specifically, the DRAM periodically reads the data stored in the unit cell and rewrites electronic charge corresponding to the read data to the storage capacitor. This operation is referred to as a refresh operation.

However, the DRAM may not perform either a read operation or a write operation when the DRAM is under a refresh operation mode. Therefore, an external device may not be able to access the DRAM during the refresh operation, which results in degradation in overall performance of the DRAM.

As the operating temperature of the DRAM increases, the period of time for which data in the storage capacitors of a DRAM cells are preserved decreases. Conversely, as the temperature of the DRAM decreases, the period of time for which data in the storage capacitor of the DRAM cell are preserved increases. Therefore, when the temperature of the DRAM cell increases, the DRAM needs to be refreshed more frequently to prevent a loss of the stored data.

However, in a conventional DRAM, the refresh period is determined according to the shortest data storing time. The shortest data storing time corresponds to when the DRAM is operating at its highest operating temperature of, for example, about 125° C. The refresh period determined in this manner is applied to the DRAM over its entire operating temperature range.

When the refresh operation occurs within the refresh period determined by the highest temperature that the DRAM can endure, the DRAM can unnecessarily perform frequent refresh operations when operating at a lower temperature. Such unnecessary refresh operations at the lower temperature may cause an increase in current consumption and lower the performance of the DRAM.

SUMMARY OF THE INVENTION

Accordingly, the present invention is provided to substantially obviate one or more problems due to limitations and disadvantages of the related art. In particular, the present invention provides a refresh control circuit and refresh method that can automatically control the refresh period according to a variation in operating temperature.

Embodiments of the present invention provide a refresh control circuit that automatically adjusts a refresh period according to temperature variation.

Embodiments of the present invention further provide a method of controlling a refresh of a semiconductor memory device that automatically adjusts a refresh period according to temperature variation.

Embodiments of the present invention further provide a refresh control circuit that reduces power consumption in a semiconductor memory device.

In one aspect, the present invention is directed to a refresh control circuit including a reference voltage generating circuit and an oscillator unit. The reference voltage generating circuit generates a reference voltage based on a variation in a drain-to-source voltage of a field effect transistor according to a temperature variation. The oscillator unit generates a pulse signal having a period that varies according to the temperature variation based on the reference voltage.

In one embodiment, the reference voltage varies inversely in proportion to the temperature.

In another embodiment, the reference voltage generating circuit comprises: a PMOS transistor having a source terminal coupled to a first power supply voltage and a gate terminal coupled to a second power supply voltage; a first resistor coupled between a drain terminal of the PMOS transistor and a first node; a second resistor having a first terminal coupled to the first node; and an NMOS transistor having drain and gate terminals coupled to a second terminal of the second resistor and a source terminal coupled to the second power supply voltage, and wherein the reference voltage is output at the first node.

In another embodiment, a drain-to-source voltage of the PMOS transistor increases as the temperature increases.

In another embodiment, the oscillator unit comprises a plurality of oscillator unit circuits that are coupled to one another in a cascade configuration.

In another embodiment, each of the oscillator unit circuits comprises: a first PMOS transistor having a source terminal coupled to a first power supply voltage and a gate terminal to which the reference voltage is applied; a second PMOS transistor having a source terminal coupled to a drain terminal of the first PMOS transistor and a gate terminal coupled to an input terminal; a third PMOS transistor having a source terminal coupled to a drain terminal of the second PMOS transistor, a gate terminal to which the reference voltage is applied and a drain terminal coupled to an output terminal; and an NMOS transistor having a drain terminal coupled to the output terminal, a gate terminal coupled to the input terminal and a source terminal coupled to the second power supply voltage.

In another embodiment, each of the oscillator unit circuits further comprises: a first capacitive element coupled between the first power supply voltage and the output terminal; and a second capacitive element coupled between the second power supply voltage and the output terminal.

In another embodiment, the reference voltage varies in proportion to the temperature.

In another embodiment, the reference voltage generating circuit comprises: a PMOS transistor having a source terminal coupled to a first power supply voltage and drain and gate terminals coupled to each other; a first resistor coupled between a drain terminal of the PMOS transistor and a first node; a second resistor having a first terminal coupled to the first node; and an NMOS transistor having a drain terminal coupled to a second terminal of the second resistor, a gate terminal coupled to the first power supply voltage and a source terminal coupled to a second power supply voltage, and wherein the reference voltage is output at the first node.

In another embodiment, a drain-to-source voltage of the NMOS transistor increases as the temperature increases.

In another embodiment, the oscillator unit comprises a plurality of oscillator unit circuits that are coupled to one another in a cascade configuration.

In another embodiment, each of the oscillator unit circuits comprises: a PMOS transistor having a source terminal coupled to a first power supply voltage, a gate terminal coupled to an input terminal and drain terminal coupled to an output terminal; a first NMOS transistor having a drain terminal coupled to the output terminal and a gate terminal to which the reference voltage is applied; a second NMOS transistor having a, drain terminal coupled to a source terminal of the first NMOS transistor and a gate terminal coupled to the input terminal; and a third NMOS transistor having a drain terminal coupled to a source terminal of the second NMOS transistor, a gate terminal to which the reference voltage is applied and a source terminal coupled to a second power supply voltage.

In another embodiment, each of the oscillator unit circuits further comprises: a first capacitive element coupled between the first power supply voltage and the output terminal; and a second capacitive element coupled between the second power supply voltage and the output terminal.

In another embodiment, the circuit further comprises an inverter configured to invert an output signal of the oscillator unit and to increase a current driving capacity.

In another embodiment, the circuit further comprises a counter configured to extend a period of the pulse signal.

In another aspect, the present invention is directed to a refresh control circuit including a first reference voltage generating circuit, a second reference voltage generating circuit and an oscillator unit. The first reference voltage generating circuit generates a first reference voltage based on a variation in a drain-to-source voltage of a field effect transistor according to temperature variation, wherein the first reference voltage decreases according to an increase of the temperature variation. The second reference voltage generating circuit generates a second reference voltage based on a variation in a drain-to-source voltage of a field effect transistor according to the temperature variation, wherein the second reference voltage increases according to an increase of the temperature. The oscillator unit generates a pulse signal having a period that varies according to the temperature variation based on the first and second reference voltages.

In one embodiment, the first reference voltage generating circuit comprises: a PMOS transistor having a source terminal coupled to a first power supply voltage and a gate terminal coupled to a second power supply voltage; a first resistor coupled between a drain terminal of the PMOS transistor and a first node; a second resistor having a first terminal coupled to the first node; and an NMOS transistor having drain and gate terminals commonly coupled to a second terminal of the second resistor and a source terminal coupled to the second power supply voltage, and wherein the first reference voltage is output at the first node.

In another embodiment, a drain-to-source voltage of the PMOS transistor increases as the temperature increases.

In another embodiment, the second reference voltage generating circuit comprises: a PMOS transistor having a source terminal coupled to a first power supply voltage and drain and gate terminals coupled to each other; a first resistor coupled between a drain terminal of the PMOS transistor and a first node; a second resistor having a first terminal coupled to the first node; and an NMOS transistor having a drain terminal coupled to a second terminal of the second resistor, a gate terminal coupled to the first power supply voltage and a source terminal coupled to a second power supply voltage, and wherein the second reference voltage is output at the first node.

In another embodiment, a drain-to-source voltage of the NMOS transistor increases as the temperature increases.

In another embodiment, the oscillator unit comprises a plurality of oscillator unit circuits that are coupled to one another in a cascade configuration.

In another embodiment, each of the oscillator unit circuits comprises: a first PMOS transistor having a source terminal coupled to a first power supply voltage and a gate terminal to which the reference voltage is applied; a second PMOS transistor having a source terminal coupled to a drain terminal of the first PMOS transistor and a gate terminal coupled to an input terminal; a third PMOS transistor having a source terminal coupled to a drain terminal of the second PMOS transistor, a gate terminal to which the reference voltage is applied and a drain terminal coupled to an output terminal; a first NMOS transistor having a drain terminal coupled to the output terminal and a gate terminal to which the reference voltage is applied; a second NMOS transistor having a drain terminal coupled to a source terminal of the first NMOS transistor and a gate terminal coupled to the input terminal; and a third NMOS transistor having a drain terminal coupled to a source terminal of the second NMOS transistor, agate terminal to which the reference voltage is applied and a source terminal coupled to a second power supply voltage.

In another embodiment, each of the oscillator unit circuits further comprises: a first capacitive element coupled between the first power supply voltage and the output terminal; and a second capacitive element coupled between the second power supply voltage and the output terminal.

In another embodiment, the circuit further comprises an inverter configured to invert an output signal of the oscillator unit and to increase a current driving capacity.

In another embodiment, the circuit further comprises a counter configured to extend a period of the pulse signal.

In another aspect, the present invention is directed to an oscillating circuit comprising: a first reference voltage generating circuit configured to generate a first reference voltage based on a variation in a drain-to-source voltage of a field effect transistor according to a temperature variation, wherein the first reference voltage is decreased according to an increase of the temperature; a second reference voltage generating circuit configured to generate a second reference voltage based on a variation in a drain-to-source voltage of a field effect transistor according to the temperature variation, wherein the second reference voltage is increased according to an increase of the temperature; and an oscillator unit configured to generate a pulse signal having a period that varies according to the temperature variation based on the first and second reference voltages.

In one embodiment, the first reference voltage generating circuit comprises: a PMOS transistor having a source terminal coupled to a first power supply voltage and a gate terminal coupled to a second power supply voltage; a first resistor coupled between a drain terminal of the PMOS transistor and a first node; a second resistor having a first terminal coupled to the first node; and an NMOS transistor having drain and gate terminals commonly coupled to a second terminal of the second resistor and a source terminal coupled to the second power supply voltage, and wherein the first reference voltage is output at the first node.

In another embodiment, a drain-to-source voltage of the PMOS transistor increases as the temperature increases.

In another embodiment, the second reference voltage generating circuit comprises: a PMOS transistor having a source terminal coupled to a first power supply voltage and drain and gate terminals coupled to each other; a first resistor coupled between a drain terminal of the PMOS transistor and a first node; a second resistor having a first terminal coupled to the first node; and an NMOS transistor having a drain terminal coupled to a second terminal of the second resistor, a gate terminal coupled to the first power supply voltage and a source terminal coupled to a second power supply voltage, and wherein the second reference voltage is output at the first node.

In another embodiment, a drain-to-source voltage of the NMOS transistor increases as the temperature increases.

In another aspect, the present invention is directed to a method of controlling a refresh of a semiconductor memory device that includes generating a reference voltage based on a variation in a drain-to-source voltage of a field effect transistor according to a temperature variation; and generating a pulse signal having a period that varies according to the temperature variation based on the reference voltage.

In another aspect, the present invention is directed to a method of controlling a refresh of a semiconductor memory device that includes generating a first reference voltage based on a drain-to-source voltage of a field effect transistor, the first reference voltage being decreased according to an increase of a temperature; generating a second reference voltage based on a drain-to-source voltage of a field effect transistor, the second reference voltage being increased according to an increase of the temperature; and generating a pulse signal having a period that varies according to the temperature variation based on the first and second reference voltages.

BRIEF DESCRIPTION OF THE DRAWINGS

The present invention will become more apparent to those of ordinary skill in the art by describing, in detail, example embodiments thereof with reference to the attached drawings, wherein like elements are represented by like reference numerals, which are given by way of illustration only and thus do not limit the example embodiments of the present invention.

DETAILED DESCRIPTION OF EMBODIMENTS OF THE INVENTION

Hereinafter, the present invention will be explained in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or, "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
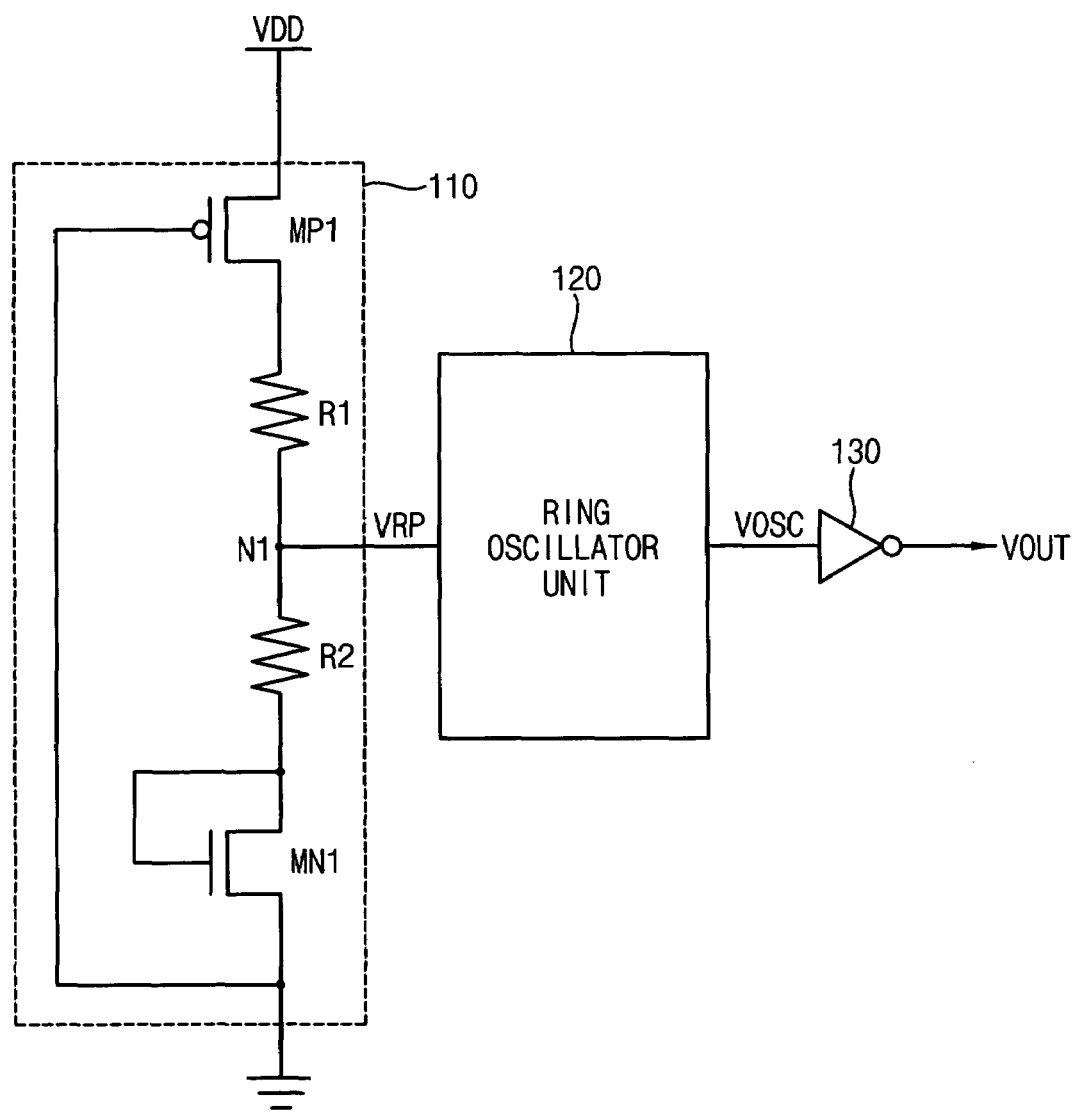
FIG. 1 is a circuit diagram illustrating a refresh control circuit according to an example embodiment of the present invention.

FIG. 1 is a circuit diagram illustrating a refresh control circuit according to an example embodiment of the present invention. Referring to FIG. 1, the refresh control circuit includes a reference voltage generating circuit 110 and a ring oscillator unit 120. In addition, the refresh control circuit can further include an inverter 130 for inverting an output signal VOSC of the ring oscillator unit 120 and increasing a current driving capability.

The reference voltage generating circuit 110 generates a reference voltage VRP based on a variation of a drain-to-source voltage (Vds) of a field-effect transistor (FET) that varies according to variation in operating temperature of the device. For example, the reference voltage decreases in response to an increase in operating temperature. The ring oscillator unit 120 generates a pulse signal VOSC having a period that varies in response to the temperature variation based on the reference voltage VRP.

The reference voltage generating circuit 110 includes a PMOS transistor MP1, resistors R1, R2 and an NMOS transistor MN1.

The PMOS transistor MP1 includes a source terminal coupled to a power supply voltage (VDD) and a gate terminal coupled to a ground voltage level. The resistor R1 is coupled between a drain terminal of the PMOS transistor MP1 and a node N1. The resistor R2 has a first terminal coupled to the node N1. The NMOS transistor MN1 includes drain and gate terminals that are commonly coupled to a second terminal of the resistor R2 and a source terminal coupled to the ground voltage. The reference voltage VRP is output at the node N1.

Operation of the reference voltage generating circuit 110 is now described.

When the operating temperature of the PMOS transistor MP1 is increased, an absolute value of a threshold voltage of the PMOS transistor MP1 decreases relative to the threshold voltage of the PMOS transistor when the operating temperature of the PMOS transistor MP1 is lower. Therefore, when the temperature is increased, a drain current of the PMOS transistor MP1 increases and a drain-to-source voltage (Vds) of the PMOS transistor MP1 increases. Thus, when the temperature increases, the voltage level of the reference voltage VRP output at the node N1 decreases. The resistors R1 and R2 are used to reduce current consumed by the reference voltage generating circuit 110, and to stabilize the reference voltage VRP. Also, when the operating temperature increases, the voltage potential of the reference voltage VRP output at the node N1 further decreases because the absolute value of the threshold voltage of the diode-connected NMOS transistor MN1 decreases.

Figure 2:
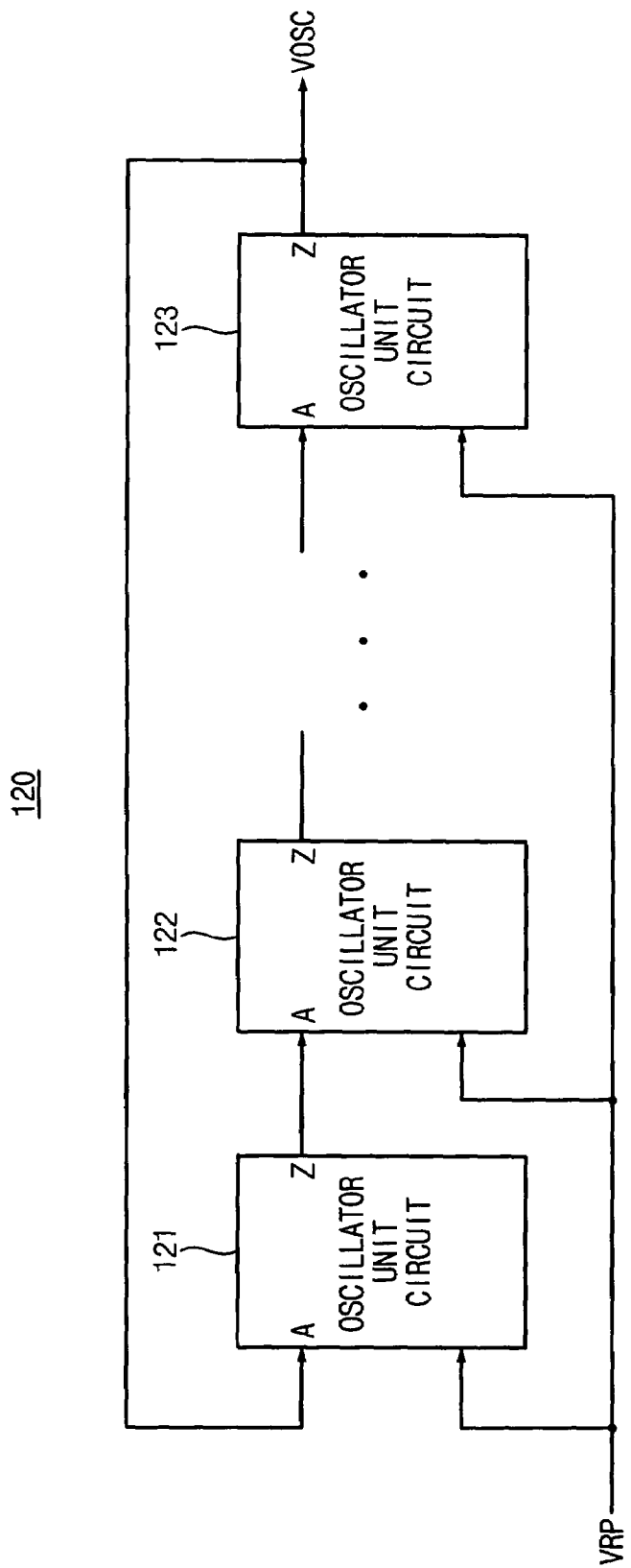
FIG. 2 is a block diagram illustrating a ring oscillator unit in the refresh control circuit in FIG. 1.

FIG. 2 is a block diagram illustrating a ring oscillator unit 120 in the refresh control circuit in FIG. 1. Referring to FIG. 1, the ring oscillator unit 120 includes a plurality of oscillator unit circuits 121, 122 and 123 that are cascade-connected together.

Each of the oscillator unit circuits 121, 122 and 123 outputs a pulse signal having a predetermined period that is based on the reference voltage VRP. The output pulse signal is provided to a following oscillator unit circuit 121, 122 . . . 123. In one embodiment, the ring oscillator unit 120 can include N oscillator unit circuits, wherein N is an odd number exceeding three.

Figure 3:
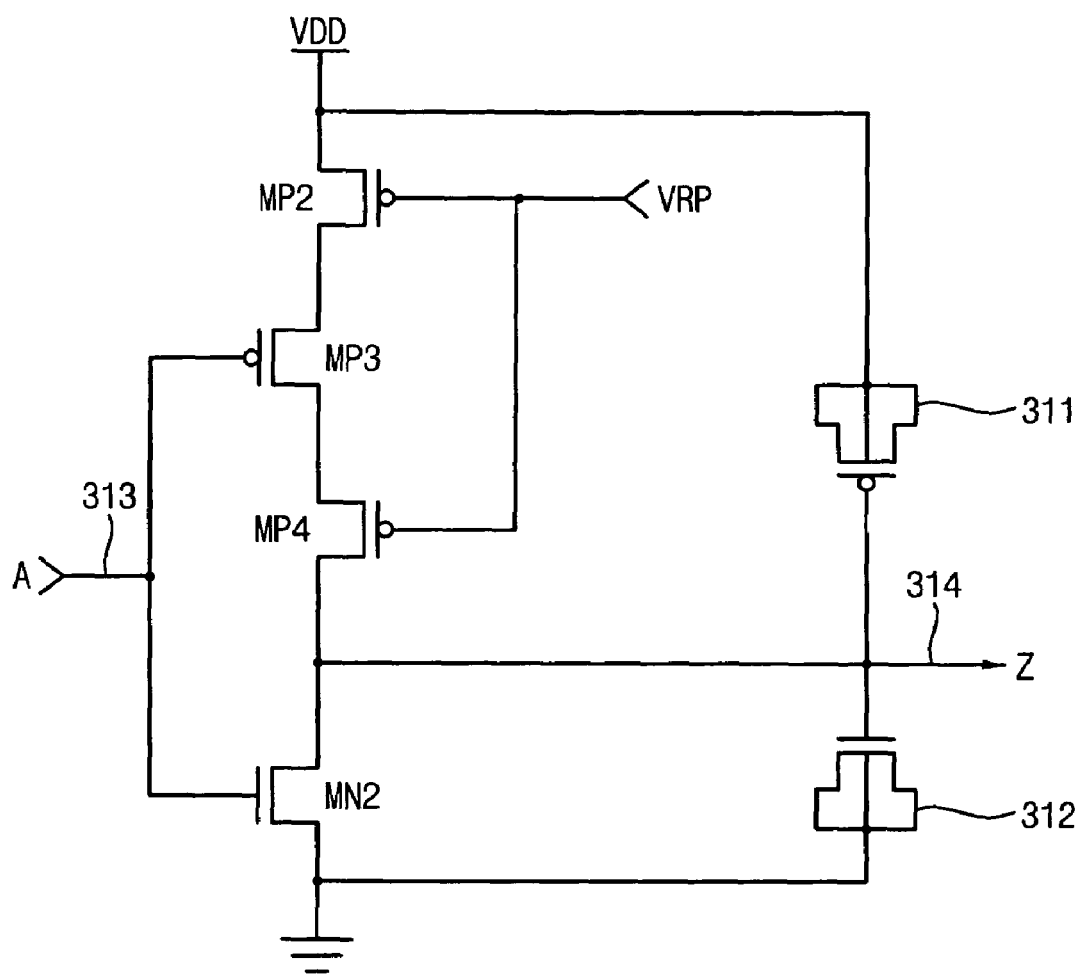
FIG. 3 is a circuit diagram illustrating an oscillator unit circuit of the ring oscillator unit of FIG. 2.

FIG. 3 is a circuit diagram illustrating an oscillator unit circuit included in the ring oscillator unit 120 of FIG. 2. Referring to FIG. 3, each of the oscillator unit circuits 121, 122 or 123 includes PMOS transistors MP2, MP3 and MP4 and an NMOS transistor MN2. In addition, each of the oscillator unit circuits 121, 122 and 123 can optionally include capacitors 311 and 312.

A first PMOS transistor MP2 has a source terminal coupled to a power supply voltage (VDD) and a gate terminal to which the reference voltage VRP is applied. A second PMOS transistor MP3 has a source terminal coupled to a drain terminal of the first PMOS transistor MP2 and a gate terminal coupled to an input terminal 313. A third PMOS transistor MP4 has a source terminal coupled to a drain terminal of the second PMOS transistor MP3, a gate terminal to which the reference voltage VRP is input, and a drain terminal coupled to an output terminal Z 314. The NMOS transistor has a drain terminal coupled to the output terminal 314, a gate terminal coupled to the input terminal 313, and a source terminal coupled to the ground. The capacitors 311 and 312 including MOS transistors are used to stabilize a signal Z output at the output terminal 314.

An operation of the refresh control circuit according to an example embodiment of the present invention will now be described in further detail with reference to FIGS. 1 through 3.

The reference voltage VRP, which is output from the reference voltage generating circuit 110, decreases as the operating temperature of the device increases. When the reference voltage VRP decreases, the PMOS transistors MP2, MP4 in the oscillator unit circuit of FIG. 3 turn on more quickly to provide a current. Therefore, an output signal Z of the oscillator unit circuit more quickly transitions from a logic "low" state to a logic "high" state. Therefore, the refresh control circuit of FIG. 1 decreases the period of an output signal VOUT thereof as the temperature increases.

Figure 4:
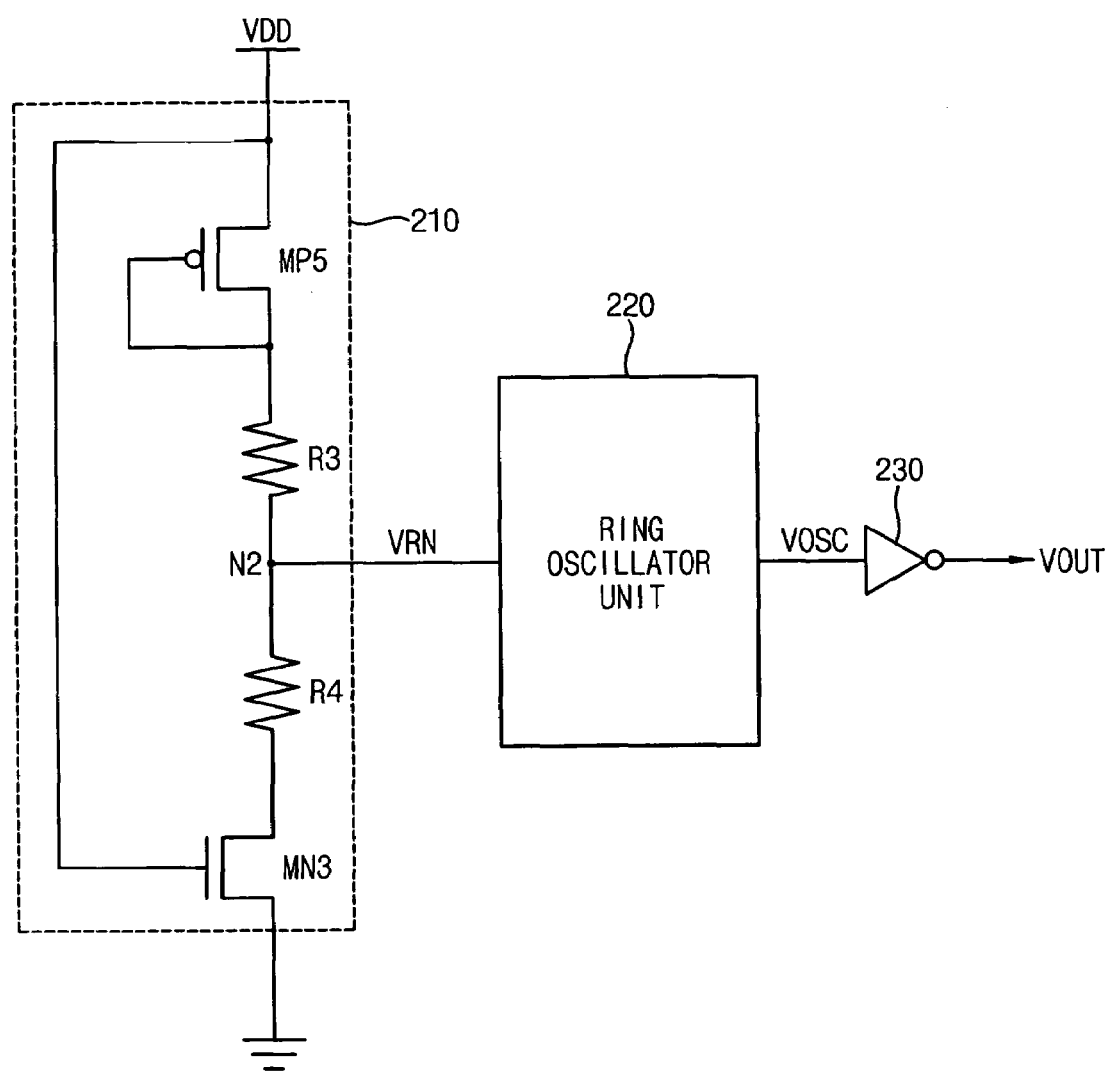
FIG. 4 is a circuit diagram illustrating a refresh control circuit according to another example embodiment of the present invention.

FIG. 4 is a circuit diagram illustrating a refresh control circuit according to another example embodiment of the present invention. Referring to FIG. 4, the refresh control circuit includes a reference voltage generating circuit 210 and a ring oscillator unit 220. In addition, the refresh control circuit can include an inverter 230 to invert an output signal VOSC of the ring oscillator unit 220 and to increase current driving capability.

A reference voltage generating circuit 210 generates a reference voltage VRN that increases in response to an increase in operating temperature, based on the variation of a drain-to-source voltage (Vds) of a field-effect transistor that varies in response to the operating temperature. The ring oscillator unit 220 generates a pulse signal (VOSC) having a period that varies according to a temperature variation based on the reference voltage VRN.

Operation of the reference voltage generating circuit 210 is now described.

When the operating temperature increases, the absolute value of the threshold voltage of an NMOS transistor MN1 decreases relative to that of the NMOS transistor MN1 operating at a lower temperature. Therefore, when the operating temperature is higher, the drain current of an NMOS transistor MN3 increases, and the drain-to-source voltage (Vds) of the NMOS transistor MN3 increases.

When the operating temperature increases, the reference voltage VRN output at the node N1 increases. Resistors R3 and R4 are used to decrease the current consumed by the reference voltage generating circuit 210 and to stabilize the reference voltage VRN output at the node N1.

In addition, when the operating temperature increases, the absolute value of the threshold voltage of the diode-connected PMOS transistor MP5 decreases so that a voltage difference between a voltage at a node N2 and a power supply voltage decreases. Therefore, the reference voltage VRN output at the node N2 increases further.

Figure 5:
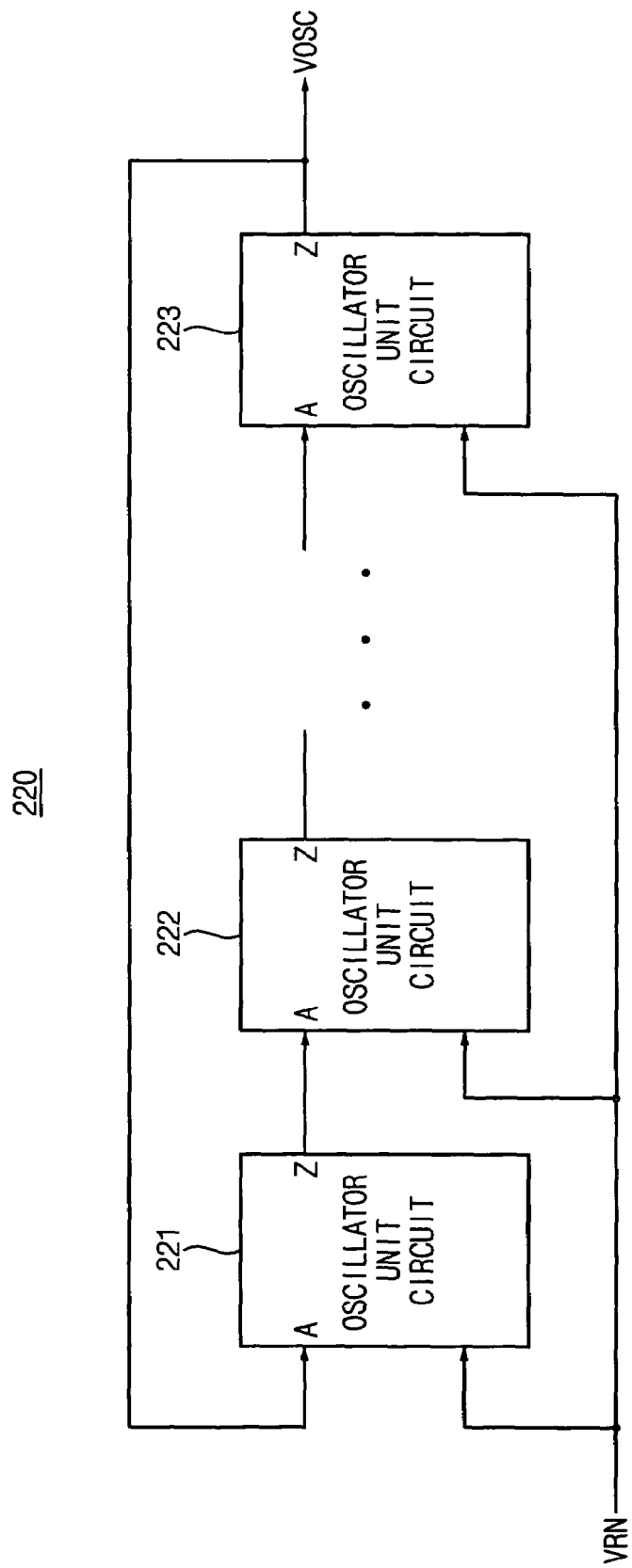
FIG. 5 is a block diagram illustrating a ring oscillator of the refresh control circuit in FIG. 4.

FIG. 5 is a block diagram illustrating a ring oscillator unit 220 of the refresh control circuit in FIG. 4. Referring to FIG. 5, the ring oscillator unit 220 includes a plurality of oscillator unit circuits 221, 222 and 223, which are cascade-connected together.

Each of the oscillator unit circuits 221, 222 and 223 outputs a pulse signal having a predetermined period in response to the reference voltage VRN. The output pulse signal is provided to a following oscillator unit circuit. Alternatively, the ring oscillator unit 220 may include M oscillator unit circuits, wherein M is an odd number exceeding three.

Figure 6:
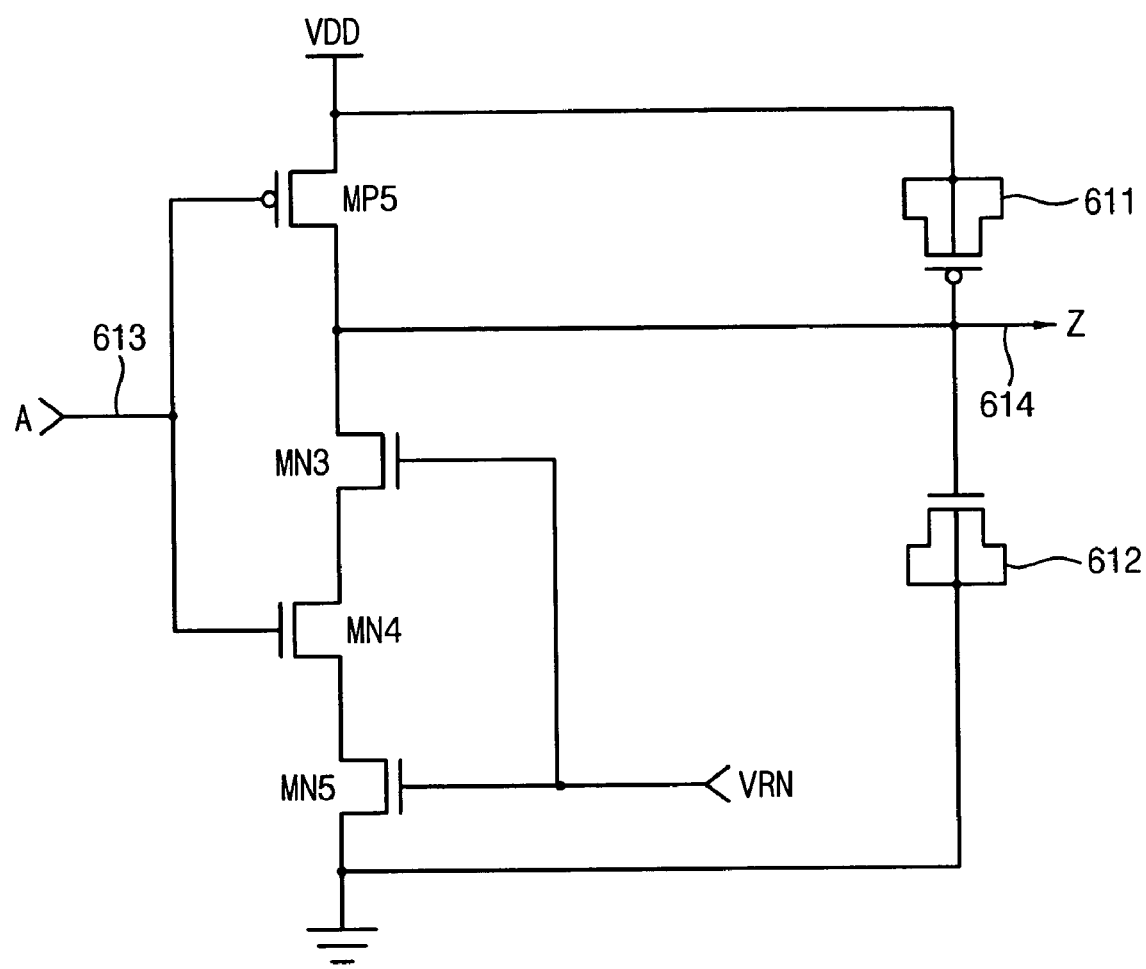
FIG. 6 is a circuit diagram illustrating an oscillator unit circuit of the ring oscillator unit of FIG. 5.

FIG. 6 is a circuit diagram illustrating the oscillator unit circuit 221, 222 or 223 of the ring oscillator unit of FIG. 5. Referring to FIG. 6, each of the oscillator unit circuits 221, 222 and 223 includes a PMOS transistor MP5, and NMOS transistors MN3, MN4 and MN5. In addition, each of the oscillator unit circuits 221, 222 and 223 can include capacitors 611 and 612.

The PMOS transistor MP5 includes a source terminal coupled to a power supply voltage VDD, a gate terminal coupled to an input terminal A 613 and a drain terminal coupled to an output terminal Z 614. A first NMOS transistor MN3 includes a drain terminal coupled to the output terminal Z 614 and a gate terminal to which the reference voltage VRN is applied. A second NMOS transistor MN4 has a drain terminal coupled to a source terminal of the first NMOS transistor MN3, and a gate terminal coupled to the input terminal 613. A third NMOS transistor MN5 includes a drain terminal coupled to a source terminal of the second NMOS transistor MN4, a gate terminal to which the reference voltage VRN is applied, and a source terminal coupled to a ground voltage. The capacitors 611 and 612, for example comprising MOS transistors, are used to stabilize a signal Z output from the output terminal 614.

An operation of the refresh control circuit according to an example embodiment of the present invention will be described in more detail with reference to FIGS. 4 through 6.

The reference voltage VRN, which is an output of the reference voltage generating circuit 210, increases according to an increase in operating temperature. When the reference voltage VRN increases, the NMOS transistors MN4 and MN5 in the oscillator unit circuit 221, 222 or 223 of FIG. 6 turn on more quickly to provide a current. Therefore, the output signal Z of the oscillator unit circuit 221, 222 or 223 more quickly transitions from a logic "low" state to a logic "high" state. Therefore, the refresh control circuit of FIG. 4 decreases the period of an output signal VOUT thereof as the operating temperature increases.

Figure 7:
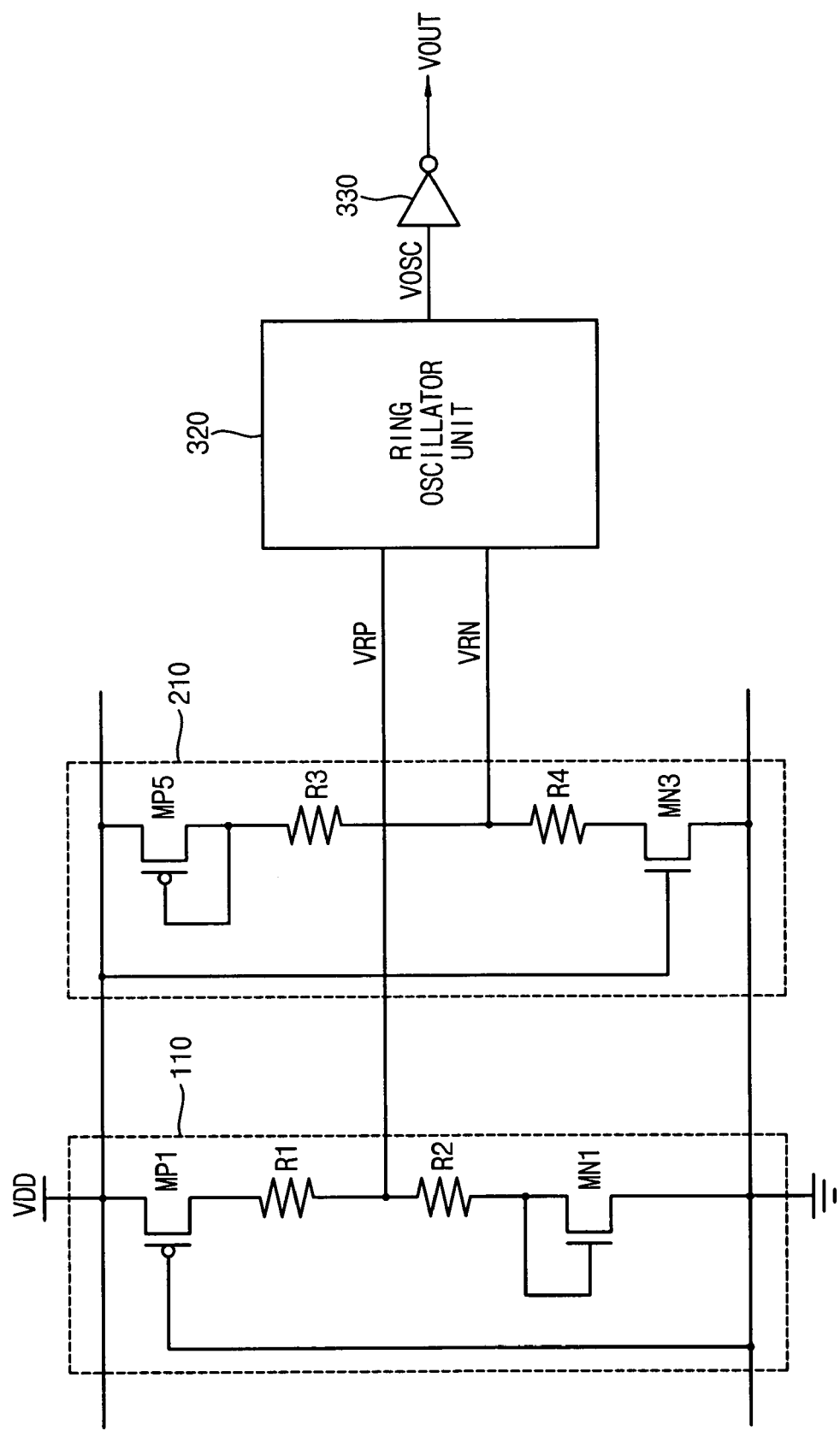
FIG. 7 is a circuit diagram illustrating a refresh control circuit according to another example embodiment of the present invention.

FIG. 7 is a circuit diagram illustrating a refresh control circuit according to another example embodiment of the present invention. Referring to FIG. 7, the refresh control circuit includes a first reference voltage generating circuit 110, a second reference voltage generating circuit 210 and a ring oscillator unit 320. In addition, the refresh control circuit can further include an optional inverter 330 to invert an output signal VOSC of the ring oscillator unit 320 and to increase current driving capability.

The first reference voltage generating circuit 110 generates a first reference voltage VRP that decreases in response to an increase in operating temperature, based on a variation of a drain-to-source voltage (Vds) of a field-effect transistor according to the temperature variation.

A second reference voltage generating circuit 210 generates a second reference voltage VRN that increases in response to an increase in operating temperature, based on a variation of a drain-to-source voltage (Vds) of a field-effect transistor according to the temperature variation.

The ring oscillator unit 320 generates a pulse signal VOSC having a period that varies according to a temperature variation based on the first reference voltage VRN and the second reference voltage VRN.

An operation of the first reference voltage generating circuit 110 is now described.

When the operating temperature becomes higher, an absolute value of a threshold voltage of a PMOS transistor MP1 is decreased from that of the PMOS transistor MP1 when operating at a lower temperature. Therefore, when the temperature is increased, a drain current of the PMOS transistor MP1 increases, and a drain-to-source voltage (Vds) of the PMOS transistor MP1 increases. Also, when the temperature increases, the output reference voltage VRP decreases.

An operation of the second reference voltage generating circuit 210 is described below.

When the operating temperature becomes higher, an absolute value of a threshold voltage of an NMOS transistor MN3 is decreased from that of the NMOS transistor MN3 when operating at a lower temperature. Therefore, when the temperature is increased, a drain current of an NMOS transistor MN3 increases, and a drain-to-source voltage (Vds) of the NMOS transistor MN3 increases. When the operating temperature increases, the output reference voltage VRN therefore increases.

Figure 8:
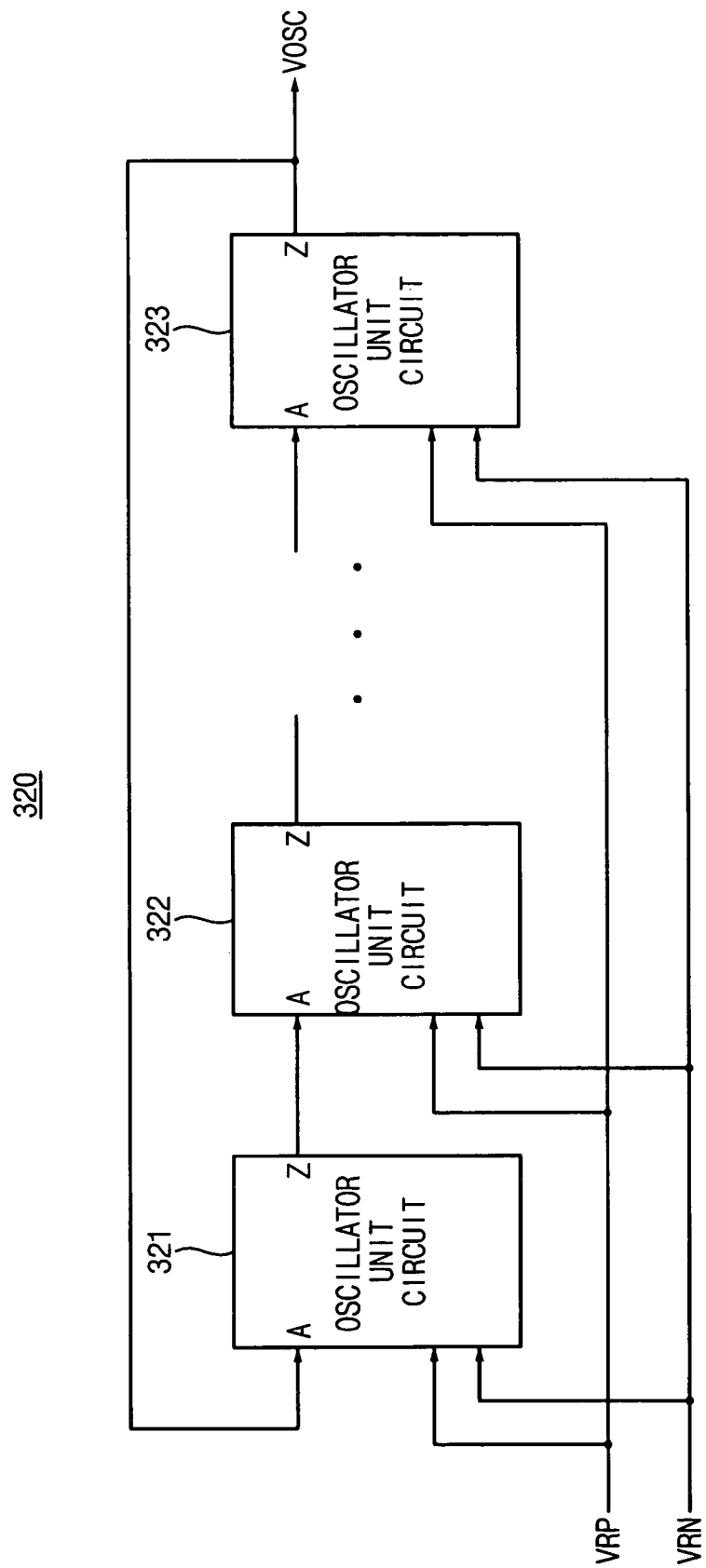
FIG. 8 is a block diagram illustrating a ring oscillator of the refresh control circuit in FIG. 7.

FIG. 8 is a block diagram illustrating a ring oscillator unit 320 of the refresh control circuit in FIG. 7. Referring to FIG. 8, the ring oscillator unit 320 includes a plurality of oscillator unit circuits 321, 322 and 323, which are cascade-connected together. Each of the oscillator unit circuits 321, 322 and 323 outputs a pulse signal having a predetermined period that is based on the reference voltage VRP and the reference voltage VRN. Herein, the output pulse signal is provided to a following oscillator unit circuit. Alternatively, the ring oscillator unit 320 may include K oscillator unit circuits, wherein K is an odd number exceeding three.

Figure 9:
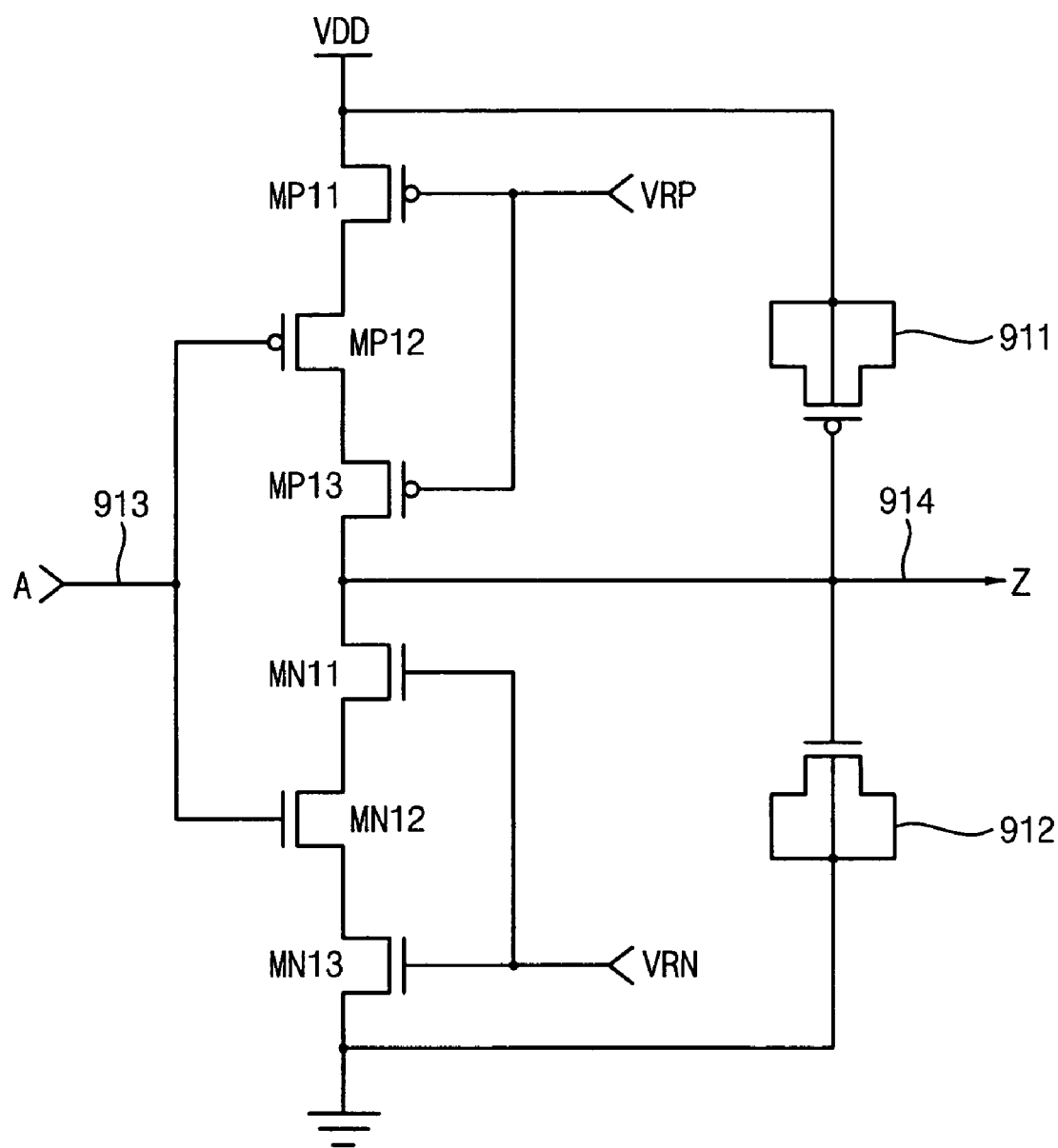
FIG. 9 is a circuit diagram illustrating an oscillator unit circuit of the ring oscillator unit of FIG. 8.
Figure 10A:
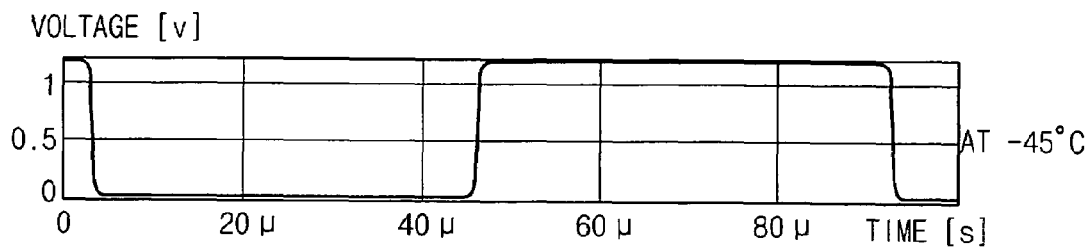
FIG. 10A through 10D are waveform diagrams illustrating simulation results of a voltage output signal of the refresh control circuit of FIG. 7.
Figure 10B:
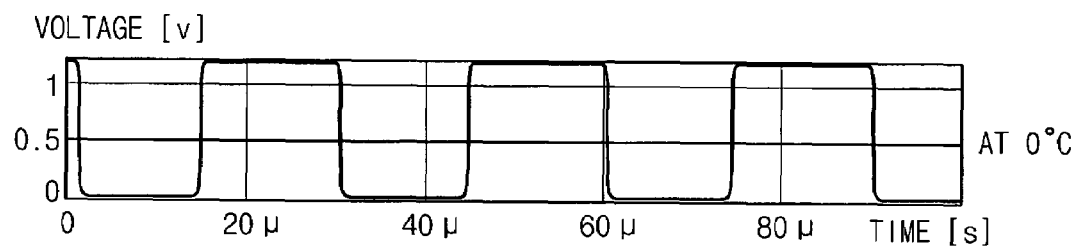
Figure 10C:
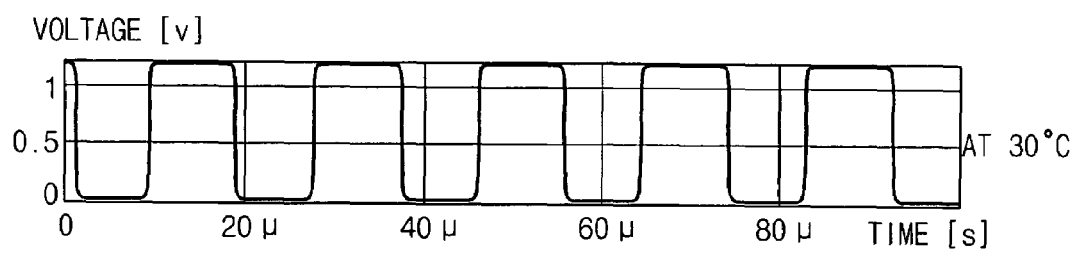
Figure 10D:
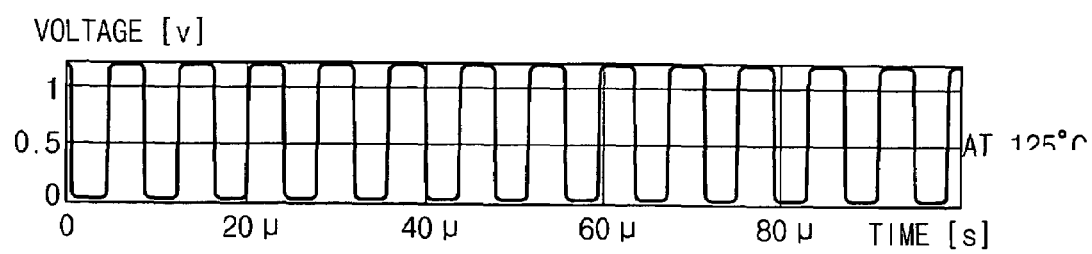

FIG. 9 is a circuit diagram illustrating an oscillator unit circuit 321, 322 or 323 of the ring oscillator unit of FIG. 8. Referring to FIG. 9, each of the oscillator unit circuits 321, 322 and 323 includes PMOS transistors MP11, MP12 and MP13 and NMOS transistors MN11, MN12 and MN13. Also, each of the oscillator unit circuits 321, 322 and 323 includes capacitors 911 and 912.

A first PMOS transistor MP11 includes a source terminal coupled to a power supply voltage (VDD), and a gate terminal to which the reference voltage VRP is applied. A second PMOS transistor MP12 includes a source terminal coupled to a drain terminal of the first PMOS transistor MP11, and a gate terminal coupled to an input terminal A 913. A third PMOS transistor MP13 includes a source terminal coupled to a drain terminal of the second PMOS transistor MP12, a gate terminal to which the reference voltage VRP is applied to, and a drain terminal coupled to an output terminal Z 914. A first NMOS transistor MN11 includes a drain terminal coupled to the output terminal Z 914, and a gate terminal to which the reference voltage VRN is applied. A second NMOS transistor MN12 includes a drain terminal coupled to a source terminal of the first NMOS transistor MN11, and a gate terminal coupled to the input terminal A 913. A third NMOS transistor MN13 includes a drain terminal coupled to the source of the second NMOS transistor MN12, a gate terminal to which the reference voltage VRN is applied, and a source terminal coupled to a ground voltage level. The capacitors 911 and 912 including MOS transistors are used to stabilize a signal Z output from the output terminal 914.

Operation of the refresh control circuit according to an example embodiment of the present invention will now be described in more detail with reference to FIGS. 7 through 9.

The reference voltage VRP, which is an output of the first reference voltage generating circuit 110, decreases when the operating temperature of the device increases. When the reference voltage VRP decreases, the PMOS transistors MP11 and MP13 in the oscillator unit circuit 321, 322 or 323 of FIG. 9 turn on more quickly to provide a current. Therefore, an output signal Z of the oscillator unit circuit 321, 322 or 323 more quickly transitions from a logic "low" state to a logic "high" state.

The reference voltage VRP, which is an output of the second reference voltage generating circuit 210, increases when the temperature increases. When the reference voltage VRN increases, the NMOS transistors MN11 and MN13 in the oscillator unit circuit 321, 322 or 323 of FIG. 9 turn on more quickly to provide a current. Therefore, an output signal Z of the oscillator unit circuit 321, 322 or 323 more quickly transitions from a logic "low" state to a logic "high" state.

Therefore, the refresh control circuit of FIG. 7 can reduce a period of the output signal VOUT thereof as the operating temperature increases.

Resistors R1, R2 and resistors R3, R4 are used to decrease the current consumed by the reference voltage generating circuits 110 and 210, respectively, and to stabilize the reference voltage VRP and the reference voltage VRN output from the reference voltage generating circuits 110 and 210.

When the temperature is increased, the absolute value of a threshold voltage of the diode-connected NMOS transistor MN1 is decreased so that the voltage potential at the output node of the first reference voltage generating circuit 110 is decreased. Accordingly, the reference voltage VRP is further decreased.

In addition, when the temperature is increased, the absolute value of a threshold voltage of a diode-connected PMOS transistor MP5 is decreased so that the voltage potential at the output node of the second reference voltage generating circuit 210 is decreased. Accordingly, the reference voltage VRN is further increased.

FIG. 10A through 10D are waveform diagrams illustrating simulation results of an output voltage signal of the refresh control circuit of FIG. 7. Referring to FIGS. 10A through 10D, an output signal of the refresh control circuit in FIG. 7 has a period of about 89.92 μs at a temperature of −45° C., about 29.82 μs at a temperature of 0° C. about 18.42 μs at a temperature of 30° C., and about 7.86 μs at a temperature of 125° C. Namely, the refresh period is automatically decreased as the temperature is increased.

Figure 11:
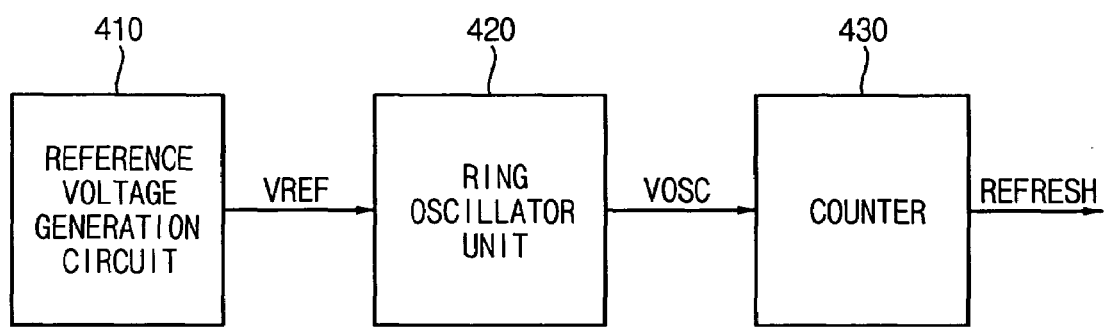
FIG. 11 is a circuit diagram illustrating a refresh control circuit including a counter according to another example embodiment of the present invention.

FIG. 11 is a circuit diagram illustrating a refresh control circuit including a counter according to another example embodiment of the present invention. Referring to FIG. 11, the refresh control circuit includes a reference voltage generating circuit 410, a ring oscillator unit 420 and a counter 430.

A reference voltage generating circuit 410 generates a reference voltage VREF based on a drain-to-source voltage (Vds) of a field-effect transistor (FET), which varies according to the variation in operating temperature. For example, the reference voltage VREF is decreased according to an increase in operating temperature.

The ring oscillator unit 420 generates a pulse signal VOSC having a period that varies according to the temperature variation based on the reference voltage VREF. The counter 430 is used to extend the period of the output signal VOSC of the ring oscillator unit 420 and to generate a refresh signal REFRESH for refreshing a DRAM memory. The counter 430 is used to extend the period of the output-signal VOSC of the ring oscillator unit 420 because the period of the output signal of the ring oscillator unit 420 is a number expressed in microsecond (μs) units, while in a real embodiment, the refresh period within which a memory cell of the DRAM is refreshed is a number expressed in millisecond (ms) units.

As described above, the refresh control circuit and the refresh control method according to the present invention operate to control the refresh period automatically in response to a variation in operating temperature. In addition, current consumption in a semiconductor memory device is reduced.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A refresh control circuit comprising:
    a reference voltage generating circuit configured to generate a reference voltage based on a variation in a drain-to-source voltage of a field effect transistor according to a temperature variation; and
    an oscillator unit configured to generate a pulse signal having a period that varies according to the temperature variation based on the reference voltage.

2. The refresh control circuit of claim 1, Wherein the reference voltage varies inversely in proportion to the temperature.

3. The refresh control circuit of claim 2, wherein the reference voltage generating circuit comprises:
    a PMOS transistor having a source terminal coupled to a first power supply voltage and a gate terminal coupled to a second power supply voltage;
    a first resistor coupled between a drain terminal of the PMOS transistor and a first node;
    a second resistor having a first terminal coupled to the first node; and
    an NMOS transistor having drain and gate terminals coupled to a second terminal of the second resistor and a source terminal coupled to the second power supply voltage, and
    wherein the reference voltage is output at the first node.

4. The refresh control circuit of claim 3, wherein a drain-to-source voltage of the PMOS transistor increases as the temperature increases.

5. The refresh control circuit of claim 2, wherein the oscillator unit comprises a plurality of oscillator unit circuits that are coupled to one another in a cascade configuration.

6. The refresh control circuit of claim 5, wherein each of the oscillator unit circuits comprises:
    a first PMOS transistor having a source terminal coupled to a first power supply voltage and a gate terminal to which the reference voltage is applied;
    a second PMOS transistor having a source terminal coupled to a drain terminal of the first PMOS transistor and a gate terminal coupled to an input terminal;
    a third PMOS transistor having a source terminal coupled to a drain terminal of the second PMOS transistor, a gate terminal to which the reference voltage is applied and a drain terminal coupled to an output terminal; and
    an NMOS transistor having a drain terminal coupled to the output terminal, a gate terminal coupled to the input terminal and a source terminal coupled to the second power supply voltage.

7. The refresh control circuit of claim 6, wherein each of the oscillator unit circuits further comprises:
    a first capacitive element coupled between the first power supply voltage and the output terminal; and
    a second capacitive element coupled between the second power supply voltage and the output terminal.

8. The refresh control circuit of claim 1, wherein the reference voltage varies in proportion to the temperature.

9. The refresh control circuit of claim 8, wherein the reference voltage generating circuit comprises:
    a PMOS transistor having a source terminal coupled to a first power supply voltage and drain and gate terminals coupled to each other;
    a first resistor coupled between a drain terminal of the PMOS transistor and a first node;

a second resistor having a first terminal coupled to the first node; and an NMOS transistor having a drain terminal coupled to a second terminal of the second resistor, a gate terminal coupled to the first power supply voltage and a source terminal coupled to a second power supply voltage, and wherein the reference voltage is output at the first node.

10. The refresh control circuit of claim 9, wherein a drain-to-source voltage of the NMOS transistor increases as the temperature increases.

11. The refresh control circuit of claim 8, wherein the oscillator unit comprises a plurality of oscillator unit circuits that are coupled to one another in a cascade configuration.

12. The refresh control circuit of claim 11, wherein each of the oscillator unit circuits comprises:

a PMOS transistor having a source terminal coupled to a first power supply voltage, a gate terminal coupled to an input terminal and drain terminal coupled to an output terminal;

a first NMOS transistor having a drain terminal coupled to the output terminal and a gate terminal to which the reference voltage is applied;

a second NMOS transistor having a drain terminal coupled to a source terminal of the first NMOS transistor and a gate terminal coupled to the input terminal; and a third NMOS transistor having a drain terminal coupled to a source terminal of the second NMOS transistor, a gate terminal to which the reference voltage is applied and a source terminal coupled to a second power supply voltage.

13. The refresh control circuit of claim 12, wherein each of the oscillator unit circuits further comprises:

a first capacitive element coupled between the first power supply voltage and the output terminal; and a second capacitive element coupled between the second power supply voltage and the output terminal.

14. The refresh control circuit of claim 1, further comprising an inverter configured to invert an output signal of the oscillator unit and to increase a current driving capacity.

15. The refresh control circuit of claim 1, further comprising a counter configured to extend a period of the pulse signal.

16. A refresh control circuit comprising:

a first reference voltage generating circuit configured to generate a first reference voltage based on a variation in a drain-to-source voltage of a field effect transistor according to a temperature variation, wherein the first reference voltage is decreased according to an increase of the temperature;

a second reference voltage generating circuit configured to generate a second reference voltage based on a variation in a drain-to-source voltage of a field effect transistor according to the temperature variation, wherein the second reference voltage is increased according to an increase of the temperature; and an oscillator unit configured to generate a pulse signal having a period that varies according to the temperature variation based on the first and second reference voltages.

17. The refresh control circuit of claim 16, wherein the first reference voltage generating circuit comprises:

a PMOS transistor having a source terminal coupled to a first power supply voltage and a gate terminal coupled to a second power supply voltage;

a first resistor coupled between a drain terminal of the PMOS transistor and a first node;

a second resistor having a first terminal coupled to the first node; and an NMOS transistor having drain and gate terminals commonly coupled to a second terminal of the second resistor and a source terminal coupled to the second power supply voltage, and wherein the first reference voltage is output at the first node.

18. The refresh control circuit of claim 17, wherein a drain-to-source voltage of the PMOS transistor increases as the temperature increases.

19. The refresh control circuit of claim 16, wherein the second reference voltage generating circuit comprises:

a PMOS transistor having a source terminal coupled to a first power supply voltage and drain and gate terminals coupled to each other;

a first resistor coupled between a drain terminal of the PMOS transistor and a first node;

a second resistor having a first terminal coupled to the first node; and an NMOS transistor having a drain terminal coupled to a second terminal of the second resistor, a gate terminal coupled to the first power supply voltage and a source terminal coupled to a second power supply voltage, and wherein the second reference voltage is output at the first node.

20. The refresh control circuit of claim 19, wherein a drain-to-source voltage of the NMOS transistor increases as the temperature increases.

21. The refresh control circuit of claim 16, wherein the oscillator unit comprises a plurality of oscillator unit circuits that are coupled to one another in a cascade configuration.

22. The refresh control circuit of claim 21, wherein each of the oscillator unit circuits comprises:

a first PMOS transistor having a source terminal coupled to a first power supply voltage and a gate terminal to which the reference voltage is applied;

a second PMOS transistor having a source terminal coupled to a drain terminal of the first PMOS transistor and a gate terminal coupled to an input terminal;

a third PMOS transistor having a source terminal coupled to a drain terminal of the second PMOS transistor, a gate terminal to which the reference voltage is applied and a drain terminal coupled to an output terminal;

a first NMOS transistor having a drain terminal coupled to the output terminal and a gate terminal to which the reference voltage is applied;

a second NMOS transistor having a drain terminal coupled to a source terminal of the first NMOS transistor and a gate terminal coupled to the input terminal; and a third NMOS transistor having a drain terminal coupled to a source terminal of the second NMOS transistor, a gate terminal to which the reference voltage is applied and a source terminal coupled to a second power supply voltage.

23. The refresh control circuit of claim 22, wherein each of the oscillator unit circuits further comprises:

a first capacitive element coupled between the first power supply voltage and the output terminal; and a second capacitive element coupled between the second power supply voltage and the output terminal.

24. The refresh control circuit of claim 16, further comprising an inverter configured to invert an output signal of the oscillator unit and to increase a current driving capacity.

25. The refresh control circuit of claim 16, further comprising a counter configured to extend a period of the pulse signal.

26. A oscillating circuit comprising:
a first reference voltage generating circuit configured to generate a first reference voltage based on a variation in a drain-to-source voltage of a field effect transistor according to a temperature variation, wherein the first reference voltage is decreased according to an increase of the temperature;
a second reference voltage generating circuit configured to generate a second reference voltage based on a variation in a turn-on resistance of a field effect transistor according to the temperature variation, wherein the second reference voltage is increased according to an increase of the temperature; and
an oscillator unit configured to generate a pulse signal having a period that varies according to the temperature variation based on the first and second reference voltages.

27. The oscillating circuit of claim 26, wherein the first reference voltage generating circuit comprises:
a PMOS transistor having a source terminal coupled to a first power supply voltage and a gate terminal coupled to a second power supply voltage;
a first resistor coupled between a drain terminal of the PMOS transistor and a first node;
a second resistor having a first terminal coupled to the first node; and
an NMOS transistor having drain and gate terminals commonly coupled to a second terminal of the second resistor and a source terminal coupled to the second power supply voltage, and
wherein the first reference voltage is output at the first node.

28. The oscillating circuit of claim 27, wherein a drain-to-source voltage of the PMOS transistor increases as the temperature increases.

29. The oscillating circuit of claim 26, wherein the second reference voltage generating circuit comprises:
a PMOS transistor having a source terminal coupled to a first power supply voltage and drain and gate terminals coupled to each other;
a first resistor coupled between a drain terminal of the PMOS transistor and a first node;
a second resistor having a first terminal coupled to the first node; and
an NMOS transistor having a drain terminal coupled to a second terminal of the second resistor, a gate terminal coupled to the first power supply voltage and a source terminal coupled to a second power supply voltage, and
wherein the second reference voltage is output at the first node.

30. The oscillating circuit of claim 29, wherein a drain-to-source voltage of the NMOS transistor increases as the temperature increases.

31. A method of controlling a refresh of a semiconductor memory device, comprising:
generating a reference voltage based on a variation in a drain-to-source voltage of a field effect transistor according to a temperature variation; and
generating a pulse signal having a period that varies according to the temperature variation based on the reference voltage.

32. A method of controlling a refresh of a semiconductor memory device, comprising:
generating a first reference voltage based on a drain-to-source voltage of a field effect transistor, the first reference voltage being decreased according to an increase of a temperature;
generating a second reference voltage based on a drain-to-source voltage of a field effect transistor, the second reference voltage being increased according to an increase of the temperature; and
generating a pulse signal having a period that varies according to the temperature variation based on the first and second reference voltages.

* * * * *